United States Patent
Lin et al.

(10) Patent No.: US 8,533,252 B2
(45) Date of Patent: Sep. 10, 2013

(54) BROAD-BAND ACTIVE DELAY LINE

(75) Inventors: Chia-Liang Lin, Fremont, CA (US); Hsin-Che Chiang, San Jose, CA (US)

(73) Assignee: Realtek Semiconductor Corp., Hsinchu (TW)

( * ) Notice: Subject to any disclaimer, the term of this patent is extended or adjusted under 35 U.S.C. 154(b) by 991 days.

(21) Appl. No.: 12/434,690

(22) Filed: May 4, 2009

(65) Prior Publication Data
US 2010/0259324 A1     Oct. 14, 2010

Related U.S. Application Data

(63) Continuation-in-part of application No. 12/421,647, filed on Apr. 10, 2009.

(51) Int. Cl.
*G06G 7/02* (2006.01)

(52) U.S. Cl.
USPC .......................................... 708/819

(58) Field of Classification Search
USPC .......................................... 708/819
See application file for complete search history.

(56) References Cited

U.S. PATENT DOCUMENTS

| | | | | | |
|---|---|---|---|---|---|
| 3,577,139 | A | * | 5/1971 | Foerster | 341/162 |
| 3,624,539 | A | * | 11/1971 | Kao et al. | 330/84 |
| 3,624,636 | A | * | 11/1971 | Diederich | 341/116 |
| 4,004,253 | A | | 1/1977 | Takasaki et al. | |
| 6,002,299 | A | * | 12/1999 | Thomsen | 330/9 |
| 6,308,106 | B1 | | 10/2001 | Ameri | |
| 2008/0247453 | A1 | | 10/2008 | An et al. | |

OTHER PUBLICATIONS

TW Office Action dated Jan. 28, 2013.

* cited by examiner

*Primary Examiner* — Tan V. Mai
(74) *Attorney, Agent, or Firm* — McCLure, Qualey & Rodack, LLP

(57) ABSTRACT

A broad-band active delay line includes a plurality of broad-band active delay cells configured in a cascade topology. Each broad-band active delay cell includes a feedback loop and a feedforward path to achieve a high bandwidth.

21 Claims, 3 Drawing Sheets

BROAD-BAND ACTIVE DELAY LINE

RELATED APPLICATION

This application claims a continuation-in-part of U.S. application Ser. No. 12/421,647, filed on Apr. 10, 2009, having the title "HIGH-SPEED CONTINUOUS-TIME FIR FILTER", having the same inventors, the contents of which are incorporated herein by reference.

FIELD OF TECHNOLOGY

This disclosure relates generally to delay line, and in particularly relates to methods and apparatus of a broad-band active delay line.

BACKGROUND

A delay line is an apparatus for receiving an analog input signal and generating accordingly a plurality of output signals, wherein said output signals are substantially similar to the input signal but are delayed and uniformly displaced in time. For example, a particular delay line receives an analog input signal of 1 GHz and generates five output signals that are of the same frequency (1 GHz) but uniformly displaced in time with a spacing of 100 ps. A delay line usually employs a plurality of delay cells that are cascaded in sequence for generating a plurality of output signals, respectively. As long as said delay cells are substantially identical, the output signals are substantially similar but uniformly displaced in time. However, the delay cells are practically limited in bandwidth, and therefore the time spacing in the output analog signal is frequency dependent. A broad-band delay cell maintains substantially the same time spacing for signals ranging from DC to a high frequency. A broad-band delay line usually employs a plurality of transmission lines or distributed L-C networks. For an integrated circuit implementation, however, transmission lines and distributed L-C networks both demand large circuit areas. An active delay line employs transistors to achieve the function of delay. For an integrated circuit implementation, an active delay line is usually highly efficient in circuit area but the bandwidth is usually highly limited without consuming a high power to drive up the circuit speed. What is needed is a power efficient broad-band active delay line.

SUMMARY OF INVENTION

In various embodiments, a delay cell is disclosed, the delay cell comprising: a first summing amplifier for receiving an input signal and an output signal and for outputting an intermediate signal, and a second summing amplifier for receiving the input signal and the intermediate signal and for outputting the output signal.

In various embodiments, a delay line is disclosed, the delay line comprising a plurality of delay cells configured in a cascade topology, each of said delay cells comprising: a first summing amplifier for receiving an input signal and an output signal and for outputting an intermediate signal, and a second summing amplifier for receiving the input signal and the intermediate signal and for outputting the output signal.

In various embodiments, a delay cell is disclosed, the delay cell comprising a negative feedback loop in conjunction with a feedforward path.

In various embodiments, a delay line is disclosed, the delay line comprising a plurality of delay cells configured in a cascade topology, each of said delay cells comprising a negative feedback loop in conjunction with a feedforward path.

In various embodiments, a method for delaying an input signal is disclosed, the method comprising: receiving the input signal and an output signal; performing a first weighted sum on the input signal and the output signal to generate an intermediate signal; receiving the intermediate signal and the input signal; and performing a second weighted sum on the intermediate signal and the input signal to generate the output signal.

DETAILED DESCRIPTION

The following detailed description refers to the accompanying drawings which show, by way of illustration, various embodiments in which the invention may be practiced. These embodiments are described in sufficient detail to enable those skilled in the art to practice these and other embodiments. The various embodiments are not necessarily mutually exclusive, as some embodiments can be combined with one or more other embodiments to form new embodiments. The following detailed description is, therefore, not to be taken in a limiting sense.

Figure 1:
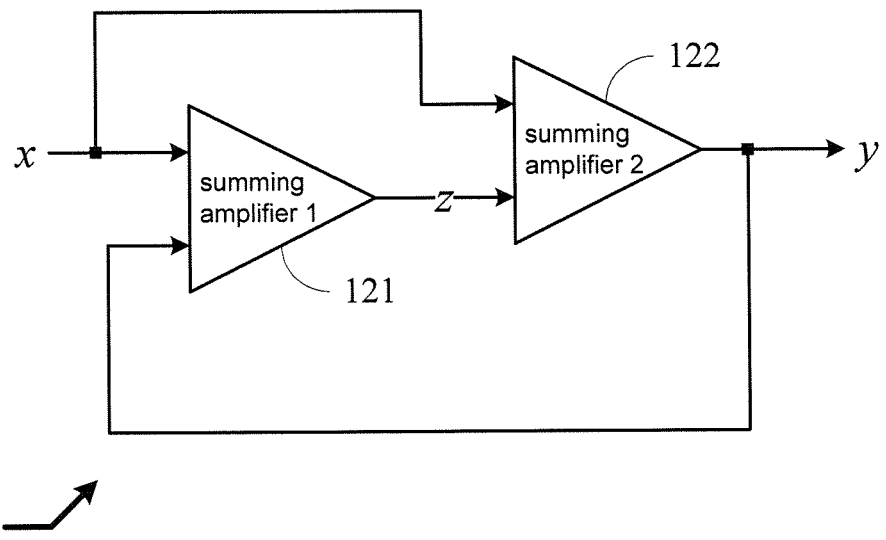
FIG. 1 shows a functional block diagram of a broadband active delay cell in accordance with the present invention.

In an embodiment depicted in FIG. 1, a delay cell 100 comprises: a first summing amplifier 121, which receives an input signal x and an output signal y and generates an intermediate signal z; and a second summing amplifier 122, which receives the input signal x and the intermediate signal z and generates the output signal y. The first amplifier 121 performs a weighted-sum function that can be mathematically modeled as:

$$Z(s) = (a_1 \cdot X(s) + a_2 \cdot Y(s)) \cdot G_1(s) \quad (1)$$

where $X(s)$, $Y(s)$, and $Z(s)$ denote the Laplace transforms of x, y, and, z, respectively, $a_1$ and $a_2$ are weights for the two summing inputs x and y, respectively, and $G_1(s)$ is a frequency response of the first summing amplifier 121. The second amplifier 122 performs a weighted-sum function that can be mathematically modeled as:

$$Y(s) = (a_3 \cdot X(s) + a_4 \cdot Z(s)) \cdot G_2(s) \quad (2)$$

where $a_3$ and $a_4$ are weights for the two summing inputs x and z, respectively, and $G_2(s)$ is a frequency response of the second summing amplifier 122. Combining Equations (1) and (2), one obtains:

$$Y(s) = X(s) \cdot [a_3 \cdot G_2(s) + a_1 \cdot a_4 \cdot G_1(s) \cdot G_2(s)] / [1 - a_2 \cdot a_4 \cdot G_1(s) \cdot G_2(s)] \quad (3)$$

The transfer function of the delay cell 100 is:

$$H(s) = Y(s)/X(s) = [a_3 \cdot G_2(s) + a_1 \cdot a_4 \cdot G_1(s) \cdot G_2(s)] / [1 - a_2 \cdot a_4 \cdot G_1(s) \cdot G_2(s)] \quad (4)$$

In various embodiments: the $G_1(s)$ and $G_2(s)$ are both positive definite functions of s; $a_1$, $a_3$, and $a_4$ are all positive; and $a_2$ is negative. In these embodiments, the delay cell 100 comprises a negative feedback loop that leads to the expression of the denominator of Equation (4). As well known in circuit design theory, a negative feedback is a useful technique to extend a bandwidth of a circuit. In addition, the delay cell 100 further comprises a feedforward path that leads to an additional term $a_3 \cdot G_2(s)$ in the numerator of Equation (4). The feedforward path is a fast path, because it effectively bypasses the first summing amplifier 121. Due to using a combination of the negative feedback and the feedforward path, the delay cell 100 can have a high bandwidth.

Figure 2:
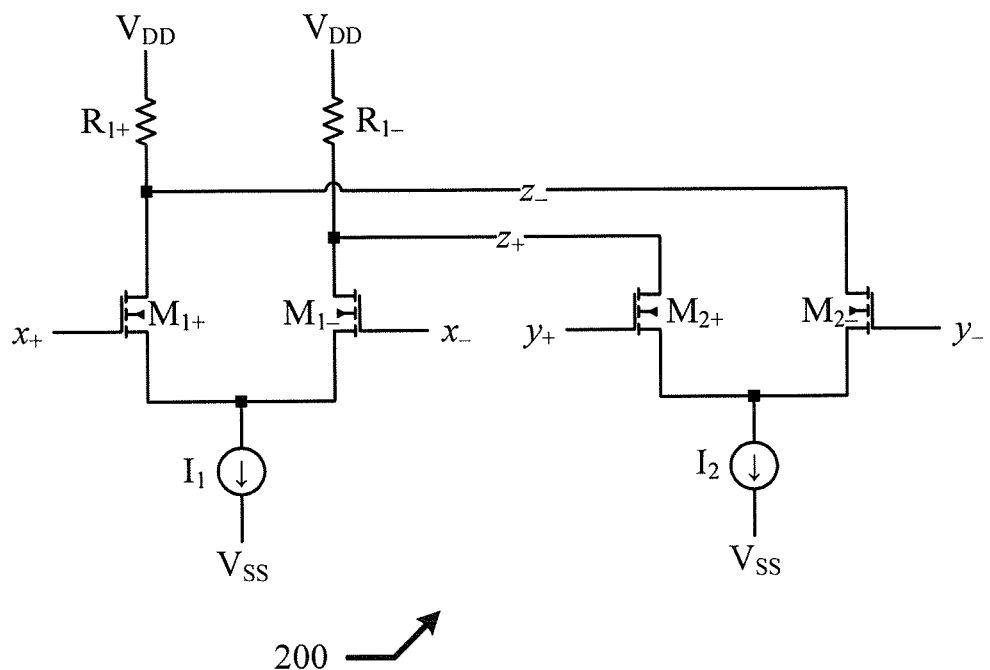
FIG. 2 shows an embodiment of a first summing amplifier suitable for used in the broadband active delay cell of FIG. 1.

An exemplary circuit 200 depicted in FIG. 2 is suitable for embodying the first summing amplifier 121 for the delay cell 100 of FIG. 1. In this embodiment, a differential circuit topology is used, wherein a signal is embodied by a positive-end signal (annotated by the subscript "+") and a negative-end signal end (annotated by the subscript "−"). For instance, the signal x is represented by the positive-end signal $x_+$ and the negative-end signal $x_-$ and the signal x is equal to a difference between the positive-end signal $x_+$ and the negative-end signal $x_-$. Circuit 200 comprises: a first differential pair comprised of two NMOS (n-channel metal-oxide semiconductor) transistors $M_{1+}$ and $M_{1-}$, a second differential pair comprised of two NMOS transistors $M_{2+}$ and $M_{2-}$, a first current source $I_1$, a second current source $I_2$, and a pair of resistors $R_{1+}$ and $R_{1-}$. Throughout this disclosure, $V_{SS}$ denotes a first virtually fixed-potential circuit node that is usually referred to as "ground," and $V_{DD}$ denotes a second virtually fixed-potential circuit node that is usually referred to as "supply." The first differential pair $M_{1+}$-$M_{1-}$ is biased by the first current source $I_1$, receives and provides amplification for the input signal x, and delivers an amplification output to the resistor pair $R_{1+}$-$R_{1-}$, which serves as a load. The second differential pair $M_{2+}$-$M_{2-}$ is biased by the second current source $I_2$, receives and provides amplification for the output signal y, and also delivers an amplification output to the resistor pair $R_{1+}$-$R_{1-}$. Since the resistor pair $R_{1+}$-$R_{1-}$ is a shared load for the first differential pair $M_{1+}$-$M_{1-}$ and the second differential pair $M_{2+}$-$M_{2-}$, the two amplification outputs are effectively summed, resulting in the intermediate signal z. In this embodiment, with reference to Equation (1), the coefficient $a_1$ is a positive number determined by the size of the first differential pair $M_{1+}$-$M_{1-}$ and the magnitude of the first current source $I_1$, while the coefficient $a_2$ is a negative number determined by the size of the second differential pair $M_{2+}$-$M_{2-}$ and the magnitude of the second current source $I_2$.

Figure 3A:
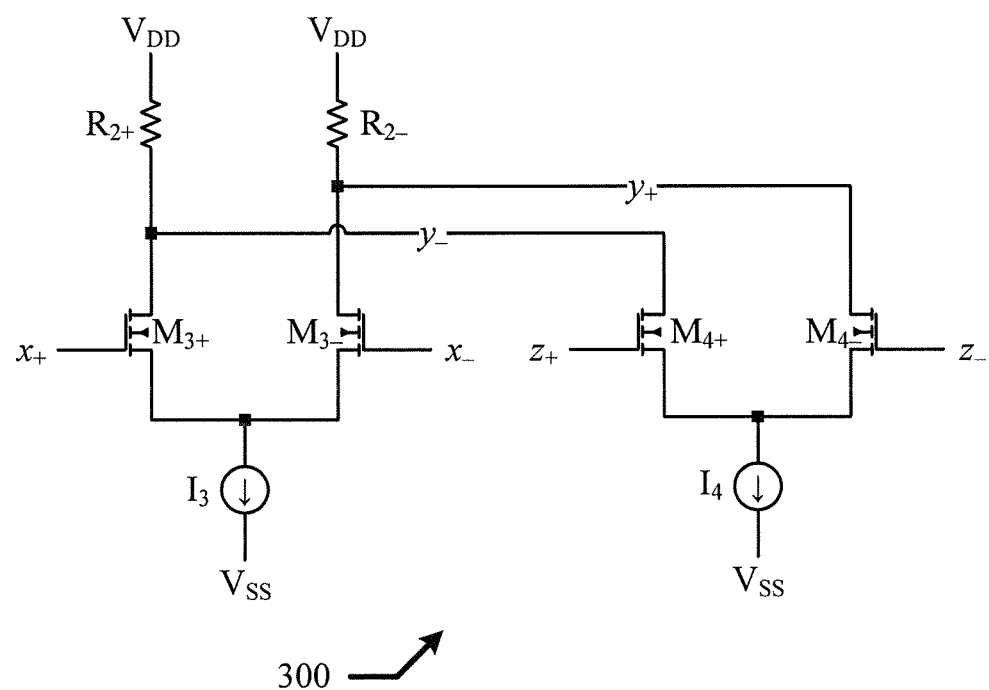
FIG. 3A shows an embodiment of a second summing amplifier suitable for used in the broadband active delay cell of FIG. 2.
Figure 3B:
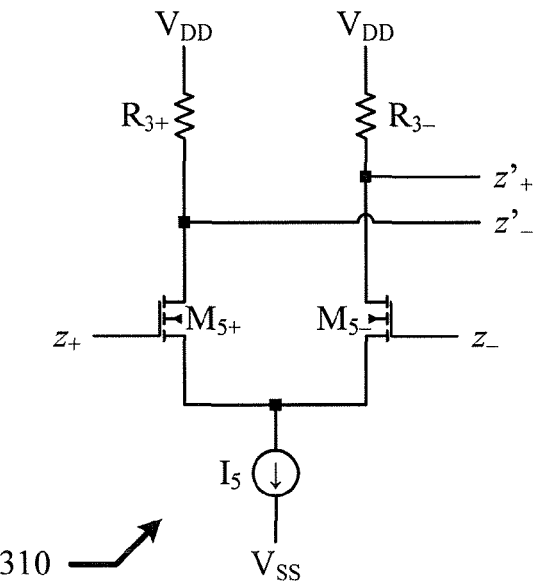
FIG. 3B shows an embodiment of a buffer circuit that can be incorporated into the second summing amplifier of FIG. 3A.

An exemplary circuit 300 depicted in FIG. 3A is suitable for embodying the second summing amplifier 122 for the delay cell 100 of FIG. 1. In this embodiment, a differential circuit topology is also used. Circuit 300 comprises: a first differential pair comprised of two NMOS transistors $M_{3+}$ and $M_{3-}$, a second differential pair comprised of two NMOS transistors $M_{4+}$ and $M_{4-}$, a first current source $I_3$, a second current source $I_4$, and a pair of resistors $R_{2+}$ and $R_{2-}$. The first differential pair $M_{3+}$-$M_{3-}$ is biased by the first current source $I_3$, receives and provides amplification for the input signal x, and delivers an amplification output to the resistor pair $R_{2+}$-$R_{2-}$, which serves as a load. The second differential pair $M_{4+}$-$M_{4-}$ is biased by the second current source $I_4$, receives and provides amplification for the intermediate signal z, and also delivers an amplification output to the resistor pair $R_{2+}$-$R_{2-}$. Since the resistor pair $R_{2+}$-$R_{2-}$ is a shared load for the first differential pair $M_{3+}$-$M_{3-}$ and the second differential pair $M_{4+}$-$M_{4-}$, the two amplification outputs are effectively summed, resulting in the output signal y. In this embodiment, with reference to Equation (2), the coefficient $a_3$ is a positive number determined by the size of the first differential pair $M_{3+}$-$M_{3-}$ and the magnitude of the first current source $I_3$, while the coefficient $a_4$ is a positive number determined by the size of the second differential pair $M_{4+}$-$M_{4-}$ and the magnitude of the second current source $I_4$. In an alternative embodiment not shown in figure, the intermediate signal z is not directly provided as input to the second differential pair $M_{4+}$-$M_{4-}$; instead, a buffer circuit 310 is used and inserted between the intermediate signal z from the first summing amplifier 121 and the second differential pair $M_{4+}$-$M_{4-}$ of the second summing amplifier 122. As illustrated in an example shown in FIG. 3B, the buffer circuit 310 comprises a third differential pair $M_{5+}$-$M_{5-}$ for receiving the intermediate signal z, and outputting a buffered signal z', which is then provided as input to the second differential pair $M_{4+}$-$M_{4-}$. The buffer circuit 310 further comprises a third current source $I_5$ for providing a bias to the third differential pair $M_{5+}$-$M_{5-}$. The buffer circuit further comprises another resistor pair $R_{3+}$-$R_{3-}$ provided as a load to the third differential pair $M_{5+}$-$M_{5-}$ for generating the buffered signal z'.

Note that circuit 200 of FIG. 2 and circuit 300 of FIG. 3 are shown by way of example but not limitation. Alternative embodiments can be employed, as long as the functions described by Equations (1) and (2) are satisfied.

Figure 4:
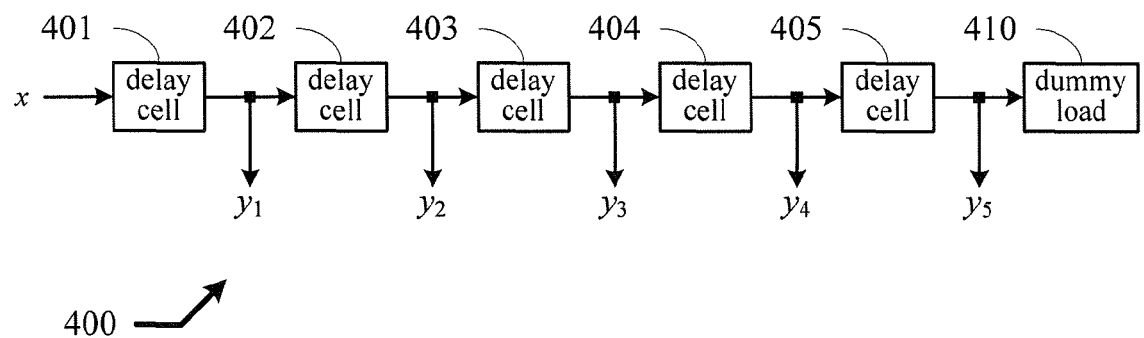
FIG. 4 shows a functional block diagram of a delay line.

By way of example but not limitation, a 5-stage delay line 400 is depicted in FIG. 4. The 5-stage delay line comprises five substantially identical delay cells 401-405 configured in a cascade topology for receiving an input signal x and generating five output signals $y_1$, $y_2$, $y_3$, and so on. The 5-stage delay line 400 further comprises a dummy load 410 used as a termination for the last delay cell 405 so that all delay cells see substantially identical load impedance. Each delay cell is a broad-band active delay cell comprising a negative feedback loop and a feedforward path, exemplified by the delay cell 100 of FIG. 1.

Although specific embodiments have been illustrated and described herein, it will be appreciated by those of ordinary skill in the art that any arrangement that is calculated to achieve the same purpose may be substituted for the specific embodiments shown. This application is intended to cover adaptations and variations of the embodiments discussed herein. Various embodiments use permutations and/or combinations of embodiments described herein. It is to be understood that the above description is intended to be illustrative, and not restrictive, and that the phraseology or terminology employed herein is for the purpose of description.

What is claimed is:
1. A delay circuit comprising:
a first summing amplifier for receiving an input signal and an output signal, wherein the first summing amplifier is configured to perform a first weighted sum on the input signal and the output signal to generate an intermediate signal; and
a second summing amplifier for receiving the input signal and the intermediate signal, wherein the second summing amplifier is configured to perform a second weighted sum on the intermediate signal and the input signal to generate the output signal, wherein the output signal is substantially equal to the input signal, and wherein the output signal is delayed with respect to the input signal.
2. The circuit of claim 1, wherein the first summing amplifier comprises two differential pairs for receiving the input signal and the output signal, respectively.

3. The circuit of claim 2, wherein the two differential pairs share a load coupled to the two differential pairs for generating the intermediate signal.

4. The circuit of claim 3 further comprises two current sources for providing a bias for the two differential pairs, respectively.

5. The circuit of claim 2, wherein the second summing amplifier comprises two differential pairs for receiving the input signal and the intermediate signal, respectively.

6. The circuit of claim 1, wherein the second summing amplifier comprises two differential pairs for receiving the input signal and the intermediate signal, respectively.

7. The circuit of claim 6 further comprising a common load for generating the output signal.

8. The circuit of claim 1, wherein the transfer function of the circuit is $H(s)=Y(s)/X(s)=[a_3 \cdot G_2(s)+a_1 \cdot a_4 \cdot G_1(s) \cdot G_2(s)]/[1-a_2 \cdot a_4 \cdot G_1(s) \cdot G_2(s)]$, where $X(s)$ and $Y(s)$ denote the Laplace transforms of the input signal and the output signal, respectively, $a_1$ and $a_2$ are weights for two summing inputs of the first summing amplifier, respectively, $a_3$ and $a_4$ are weights for two summing inputs of the second summing amplifier, respectively, and $G_1(s)$ and $G_2(s)$ are a frequency response of the first and the second summing amplifiers, respectively.

9. The circuit of claim 8, wherein $a_1$, $a_3$, and $a_4$ are all positive and $a_2$ is negative.

10. The circuit of claim 1, wherein the circuit comprises a feedforward path.

11. The circuit of claim 1, wherein the circuit comprises a negative feedback.

12. The circuit of claim 1, wherein the circuit comprises a negative feedback and a feedforward path.

13. The circuit of claim 1, wherein the first weighted sum is mathematically modeled as: $Z(s)=(a_1 \cdot X(s)+a_2 \cdot Y(s)) \cdot G_1(s)$, where $X(s)$, $Y(s)$, and $Z(s)$ denote the Laplace transforms of the input signal, the output signal, and the intermediate signal, respectively, $a_1$ and $a_2$ are weights for two summing inputs of the first summing amplifier, respectively and $G_1(s)$ is a frequency response of the first summing amplifier.

14. The circuit of claim 1, wherein the second weighted sum is mathematically modeled as: $Y(s)=(a_3 \cdot X(s)+a_4 \cdot Z(s)) \cdot G_2(s)$, where $X(s)$, $Y(s)$, and $Z(s)$ denote the Laplace transforms of the input signal, the output signal, and the intermediate signal, respectively, $a_3$ and $a_4$ are weights for two summing inputs of the second summing amplifier, respectively and $G_2(s)$ is a frequency response of the second summing amplifier.

15. A circuit comprising a plurality of delay cells configured in a cascade topology, wherein:

each of said delay cells comprises:

a first summing amplifier configured to receive an input signal and an output signal, wherein the first summing amplifier is configured to perform a first weighted sum on the input signal and the output signal to generate an intermediate signal, wherein the first weighted sum is performed according to Laplace transforms of the input signal, the intermediate signal, and the output signal; and a second summing amplifier configured to receive the input signal and the intermediate, wherein the second summing amplifier is configured to perform a second weighted sum on the intermediate signal and the input signal to generate the output signal.

16. A method of delaying an input signal applied to a circuit, the method comprising:

(a) receiving the input signal and an output signal;

(b) performing a first weighted sum on the input signal and the output signal to generate an intermediate signal; and (c) receiving the intermediate signal and the input signal; and (d) performing a second weighted sum on the intermediate signal and the input signal to generate the output signal, wherein the output signal is substantially equal to the input signal, and wherein the output signal is delayed with respect to the input signal.

17. The method of claim 16, wherein step (a) further comprises using two first differential pairs of the circuit to receive the input signal and the output signal, respectively.

18. The method of claim 17, wherein step (b) further comprises using a first load of the circuit for the two differential pairs to perform the first weighted sum.

19. The method of claim 16, wherein step (c) further comprises using two second differential pairs of the circuit to receive the input signal and the intermediate signal, respectively.

20. The method of claim 19, wherein step (d) further comprises using a second load of the circuit to perform the second weighted sum.

21. The method of claim 16, wherein the circuit comprises a negative feedback and a feedforward path.

* * * * *